(12) United States Patent
Subramanian et al.

(10) Patent No.: US 11,152,904 B2
(45) Date of Patent: Oct. 19, 2021

(54) PROGRAMMABLE GAIN AMPLIFIER WITH PROGRAMMABLE RESISTANCE

(71) Applicant: TEXAS INSTRUMENTS INCORPORATED, Dallas, TX (US)

(72) Inventors: Anand Subramanian, Bengaluru (IN); Tanmay Halder, Bengaluru (IN); Anand Kannan, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 91 days.

(21) Appl. No.: 16/789,540

(22) Filed: Feb. 13, 2020

(65) Prior Publication Data
US 2021/0044267 A1    Feb. 11, 2021

(30) Foreign Application Priority Data

Aug. 6, 2019   (IN) .............................. 201941031834

(51) Int. Cl.
*H03F 3/45*    (2006.01)
*H03G 3/30*    (2006.01)
*H03M 1/12*    (2006.01)

(52) U.S. Cl.
CPC ........... *H03F 3/45932* (2013.01); *H03G 3/30* (2013.01); *H03M 1/12* (2013.01); *H03F 2200/331* (2013.01); *H03F 2203/45528* (2013.01); *H03G 2201/103* (2013.01)

(58) Field of Classification Search
CPC .................................................. H03F 3/4593
See application file for complete search history.

(56) References Cited

U.S. PATENT DOCUMENTS

| 6,462,615 | B1* | 10/2002 | Tanghe | ............... H03F 3/45475 327/560 |
| 6,538,508 | B2 | 3/2003 | Cheung et al. | |
| 9,083,297 | B2 | 7/2015 | Hebert | |
| 2005/0110550 | A1* | 5/2005 | Shi | ...................... H03F 3/45973 327/307 |

(Continued)

OTHER PUBLICATIONS

International Search Report in corresponding PCT Application No. PCT/US2020/044702, dated Oct. 15, 2020 (2 pages).

*Primary Examiner* — Patricia T Nguyen
(74) *Attorney, Agent, or Firm* — John R. Pessetto; Charles A. Brill; Frank D. Cimino

(57) ABSTRACT

A circuit includes an analog-to-digital converter (ADC). The circuit also includes an analog front end (AFE) having an AFE input and an AFE output. The AFE output is coupled the ADC's input. The AFE includes a programmable gain amplifier (PGA) having a first PGA input and a second PGA input. The PGA includes a first operational amplifier (OP AMP) with first and second OPAMP inputs. The AFE also including a programmable resistance circuit having a first programmable resistance circuit input and first and second programmable resistance circuit outputs. The first programmable resistance circuit input is coupled to the first and second PGA inputs. The programmable resistance circuit includes a resistor network having first and second balance resistances. The first balance resistance is coupled to the first and second OP AMP inputs, and the second balance resistance is coupled to the first and second OP AMP inputs.

20 Claims, 6 Drawing Sheets

(56) References Cited

U.S. PATENT DOCUMENTS

| | | | |
|---|---|---|---|
| 2011/0026507 A1* | 2/2011 | Katsube | H03H 11/1291 370/338 |
| 2011/0095823 A1* | 4/2011 | Gilbert | H03G 1/0088 330/254 |
| 2013/0300503 A1* | 11/2013 | Hebert | H03G 3/001 330/254 |
| 2015/0116035 A1 | 4/2015 | Dey et al. | |
| 2015/0236648 A1* | 8/2015 | Ahmad | H03F 3/45977 330/84 |
| 2015/0357983 A1* | 12/2015 | Choi | H03F 3/393 330/254 |
| 2016/0034094 A1 | 2/2016 | Kang et al. | |
| 2017/0063340 A1* | 3/2017 | Wu | H03H 11/1217 |
| 2018/0055409 A1* | 3/2018 | Xu | H03F 3/45 |

\* cited by examiner

PROGRAMMABLE GAIN AMPLIFIER WITH PROGRAMMABLE RESISTANCE

CROSS-REFERENCE TO RELATED APPLICATIONS

This application claims priority to India Provisional Application No. 201941031834, filed Aug. 6, 2019, which is hereby incorporated by reference.

BACKGROUND

An analog-to-digital converter (ADC) converts an analog signal to a digital representation of the analog signal. ADCs are used in a wide variety of applications. One of the characterizing parameters for an analog signal chain, such as one that includes an ADC, is the common mode rejection ratio (CMRR). CMRR is a measure of how well the signal chain suppresses a common mode signal that is present on both input terminals of the signal chain. Some applications may benefit from a higher CMRR.

SUMMARY

In one example, a circuit includes an analog-to-digital converter (ADC). The circuit also includes an analog front end (AFE) having an AFE input and an AFE output. The AFE output is coupled the ADC's input. The AFE includes a programmable gain amplifier (PGA) having a first PGA input and a second PGA input. The PGA includes a first operational amplifier (OP AMP) with first and second OPAMP inputs. The AFE also including a programmable resistance circuit having a first programmable resistance circuit input and first and second programmable resistance circuit outputs. The first programmable resistance circuit input is coupled to the first and second PGA inputs. The programmable resistance circuit includes a resistor network having first and second balance resistances. The first balance resistance is coupled to the first and second OP AMP inputs, and the second balance resistance is coupled to the first and second OP AMP inputs.

BRIEF DESCRIPTION OF THE DRAWINGS

For a detailed description of various examples, reference will now be made to the accompanying drawings in which.

DETAILED DESCRIPTION

The signal chain described herein includes an analog front end (AFE) coupled to an ADC. The AFE receives an input analog signal. The AFE may include an amplifier, such as a programmable gain amplifier (PGA), to modify the magnitude of the input analog signal before it is provided to the ADC for conversion to a digital representation. The AFE described herein provides a relatively high CMRR.

Figure 1:
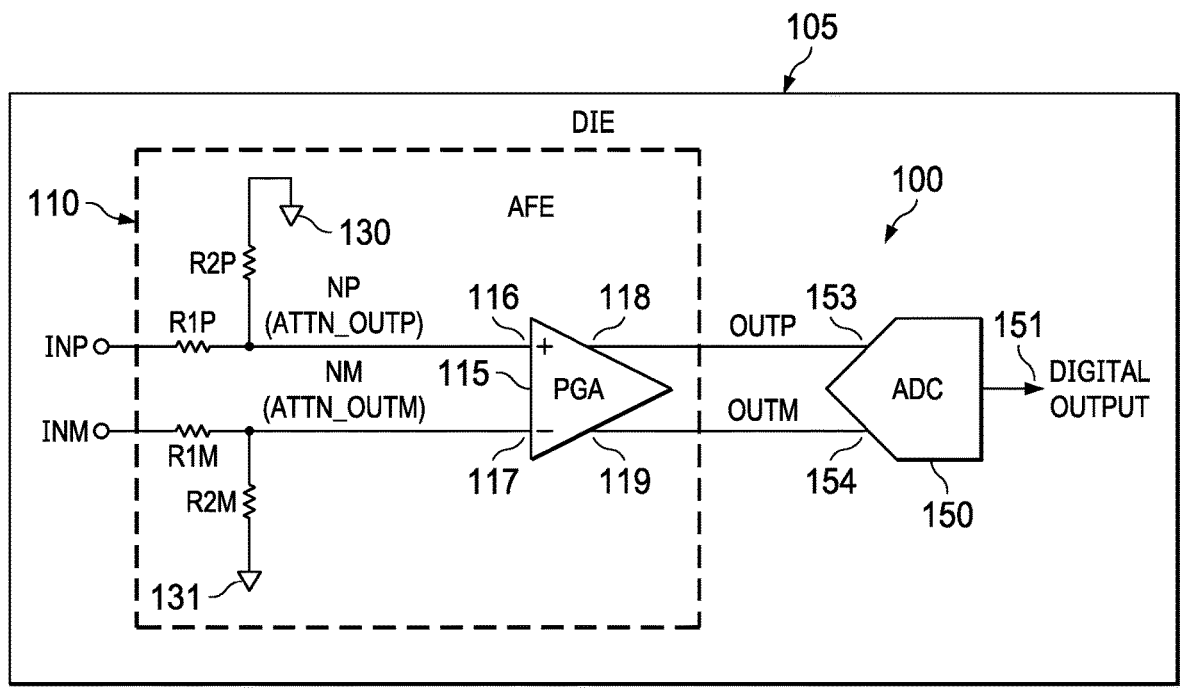
FIG. 1 illustrates a circuit signal chain including an analog front end (AFE) having a programmable gain amplifier (PGA) coupled to an analog-to-digital converter (ADC).

FIG. 1 shows an example of a circuit 100 that includes an AFE 110 coupled to an ADC 150. The AFE 110 and ADC 150 in this example are formed on the same semiconductor die 105, and thus are provided on the same chip. The output of AFE 110 is coupled to the input of the ADC 150. The AFE 110 has inputs designated Input Positive (INP) and Input Minus (INM). The INP and INM inputs receive an analog input signal (e.g., a differential analog signal), which is then processed by the AFE 110. The processed analog signal from the AFE 110 is converted to a digital representation (digital output 151) by ADC 150.

In this example, AFE 110 adjusts the magnitude of the input analog signal. The AFE 110 includes a programmable gain amplifier (PGA) 115 having a positive input 116, a negative input 117, a positive output (OUTP) 118, and a negative output (OUTM) 119. OUTP 118 and OUTM 119 are coupled to corresponding inputs 153, 154 of ADC 150. AFE 110 also includes resistors R1P, R2P, R1M, and R2M. One terminal of R1P provides the INP input and the other terminal of R1P is coupled to the positive input 116 of the PGA 115 and to one terminal of R2P at node NP. The other terminal of R2P is coupled to a ground node 130 (or to a supply voltage node). Similarly, one terminal of R1M provides the INM input and the other terminal of R1M is coupled to the negative input 117 of the PGA 115 and to one terminal of R2M at node NM. The other terminal of R2M is coupled to a ground node 131 (or another fixed voltage). Resistors R1P and R2P comprise a resistor divider to attenuate the positive input signal INP before adjustment (e.g., programmable attenuation) by PGA 115. The voltage on node NP is labeled ATTN_OUTP. Similarly, resistors R1M and R2M comprise a resistor divider to attenuate the negative input signal INP before adjustment by PGA 115. The voltage on node NM is labeled ATTN_OUTM. The ADC 150 may comprise any suitable type of ADC. In one example, ADC 150 comprises a third-order, continuous time, delta sigma ADC.

Figure 2:
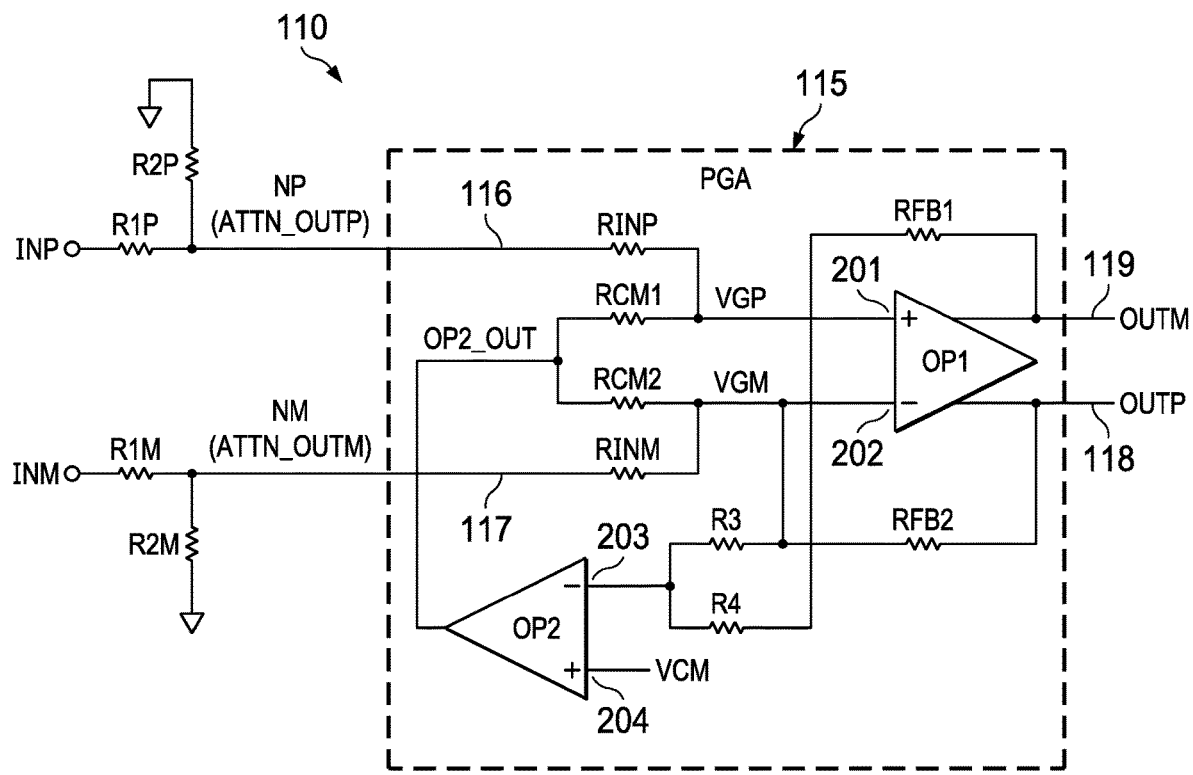
FIG. 2 illustrates the AFE of FIG. 1 with additional detail of the PGA.

FIG. 2 shows the AFE 110 with additional example detail for the PGA 115. The PGA 115 in this example includes operational amplifiers (OP AMPs) OP1 and OP2 and resistors RINP, RINM, RCM1, RCM2, R3, R4, RFB1, and RFB2. OP1 has a positive input 201 (positive virtual ground, VGP), a negative input 202 (negative virtual ground, VGM), the positive output (OUTP) 118, and the negative output (OUTM) 119. OP2 has a negative input 203 and a positive input 204. RINP is coupled between R1P (positive input 116 of PGA 115) and the positive input 201 of OP1. RINM is coupled between R1M (negative input 117 of PGA 115) and the negative input 202 of OP2. RFB1 is coupled between positive input 201 and OUTM 119, and RFB2 is coupled between the negative input 202 and OUTP 118. R4 is coupled between the positive input 201 of OP1 and the negative input 203 of OP2. R3 is coupled between negative input 202 of OP1 and negative input 203 of OP2. The common mode voltage (VCM) is a reference voltage (for example, generated by a bandgap reference) and is provided to the positive input 204 of OP2. The VCM voltage is chosen so that all nodes within the circuit remain within valid bias conditions across the input signal swing. The output of OP2 provides a signal labeled OP2_OUT and is coupled to RCM1 and RCM2. RCM1 couples to the positive input 201 of OP1, and RCM2 couples to the negative input 202 of OP1. The PGA 115 has an input common mode suppression loop (CMSL) formed, in part, by RCM1, RCM12, OP2, R3, and R4. This loop ensures that the common mode of the virtual grounds VGP and VGM at the positive and negative inputs 201 and 202 of OP1 remain at the desired level of VCM.

The CMRR of circuit 100 is determined, at least in part, by the CMRR of AFE 110. The CMRR of AFE 110 is determined by the degree of mismatch between the resistors on the positive side (i.e., R1P, R2P, RINP, and RCM1) and the corresponding resistors on the negative side (i.e., R1M, R2M, RINM, and RCM2). Due to their lower cost, many semiconductor devices implement resistors as polysilicon resistors. Polysilicon resistors, however, are characterized by relatively poor matching. Thus, it can be very difficult, if not impossible, to achieve a high CMRR using polysilicon to implement the resistors of the AFE 110. Some applications may benefit from a CMRR of 80 dB, 90 dB, or even higher. A 90 dB CMRR, for example, may not be possible using polysilicon for the resistors of the AFE architecture shown in FIG. 2.

Figure 3:
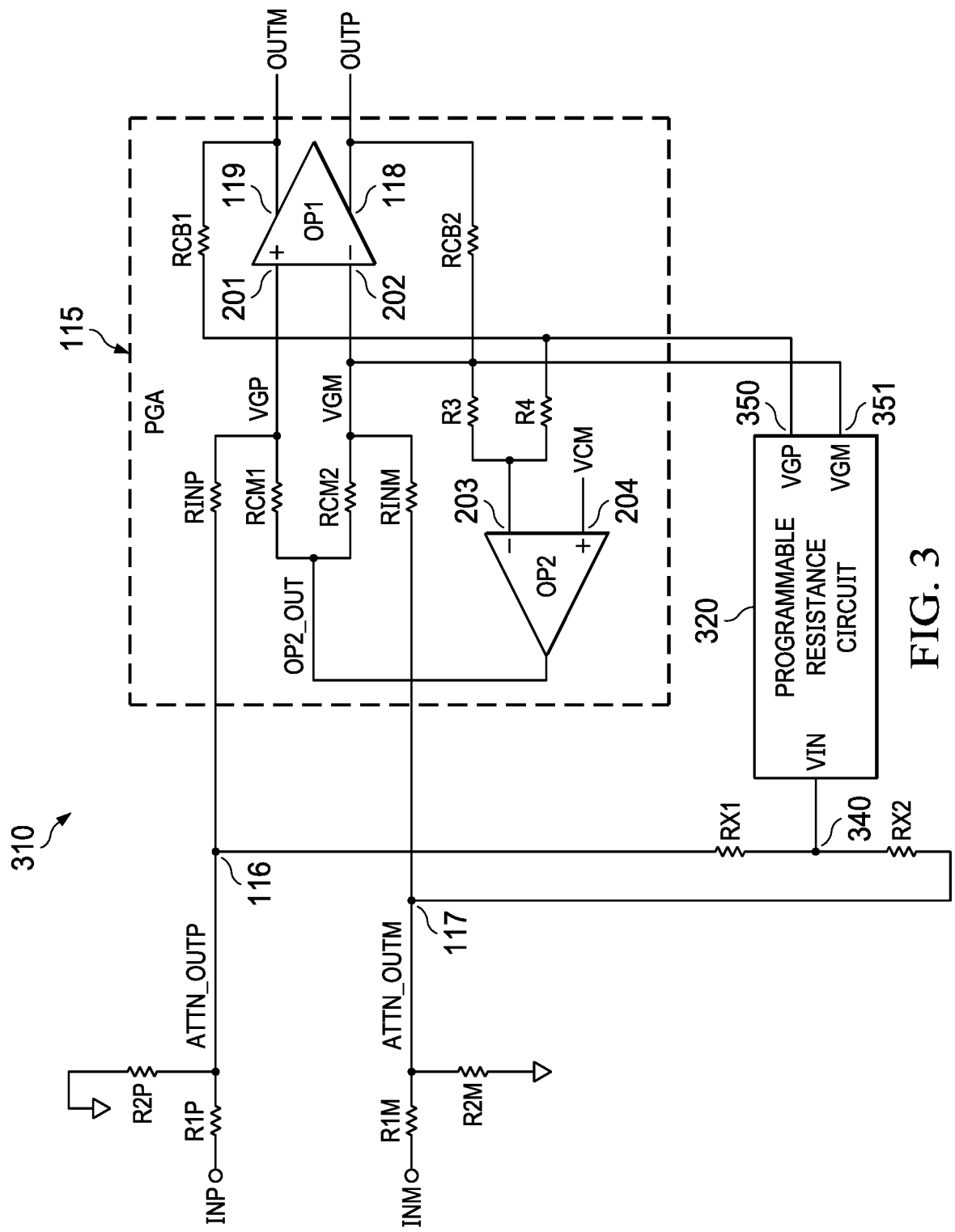
FIG. 3 shows an example of an AFE that includes a programmable resistance circuit used to compensate for resistor mismatches within the AFE.

FIG. 3 shows an example of an AFE 310 that achieves a higher CMRR (e.g., 90 dB) than the AFE 110 of FIGS. 1 and 2 while also using polysilicon resistors but with a different architecture from that shown in FIG. 2. As was the case for the architecture of AFE 110 of FIG. 2, the AFE 310 in FIG. 3 includes OP1, OP2, and resistors RINP, RINM, RCM1, RCM2, R3, R4, RFB1, and RFB2 connected together in much the same way as described above. The AFE 310 of FIG. 3 also includes a programmable resistance circuit 320 and resistors Rx1 and Rx2. Rx1 and Rx2 are connected in series between the PGA's positive and negative inputs 116 and 117 and thus between voltages ATTN_OUTP and ATTN_OUTM. In some examples, the nominal resistance of Rx1 is equal to that of Rx2 (i.e., Rx1=Rx2 ignoring resistor mismatch). The node 340 between Rx1 and Rx2 is coupled to the input terminal (VIN) of the programmable resistance circuit 320. With Rx1 being equal to Rx2, the voltage on node 340 is half-way between ATTN_OUTM and ATTN_OUTP.

The output terminals of the programmable resistance circuit 320 include output 350 and output 351. Output 350 is coupled to the positive input 201 of OP1 at VGP and output 351 is coupled to the negative input 202 of OP1 at VGM. The programmable resistance circuit 320 is trimmable to provide a programmed resistance coupled between the inputs 116, 117 of the PGA 115 and the inputs 201, 202 of OP1. The programmed resistance balances the AFE 310 for mismatches between the AFE's positive side resistors (RINP, RINP, RCM1, and RFB1) and negative side resistors (RINM, RINM, RCM2, and RFB2). All else being equal, due to the use of the programmable resistance circuit 320 the CMRR of AFE 310 is higher than that possible for the AFE 110 of FIG. 2.

Figure 4:
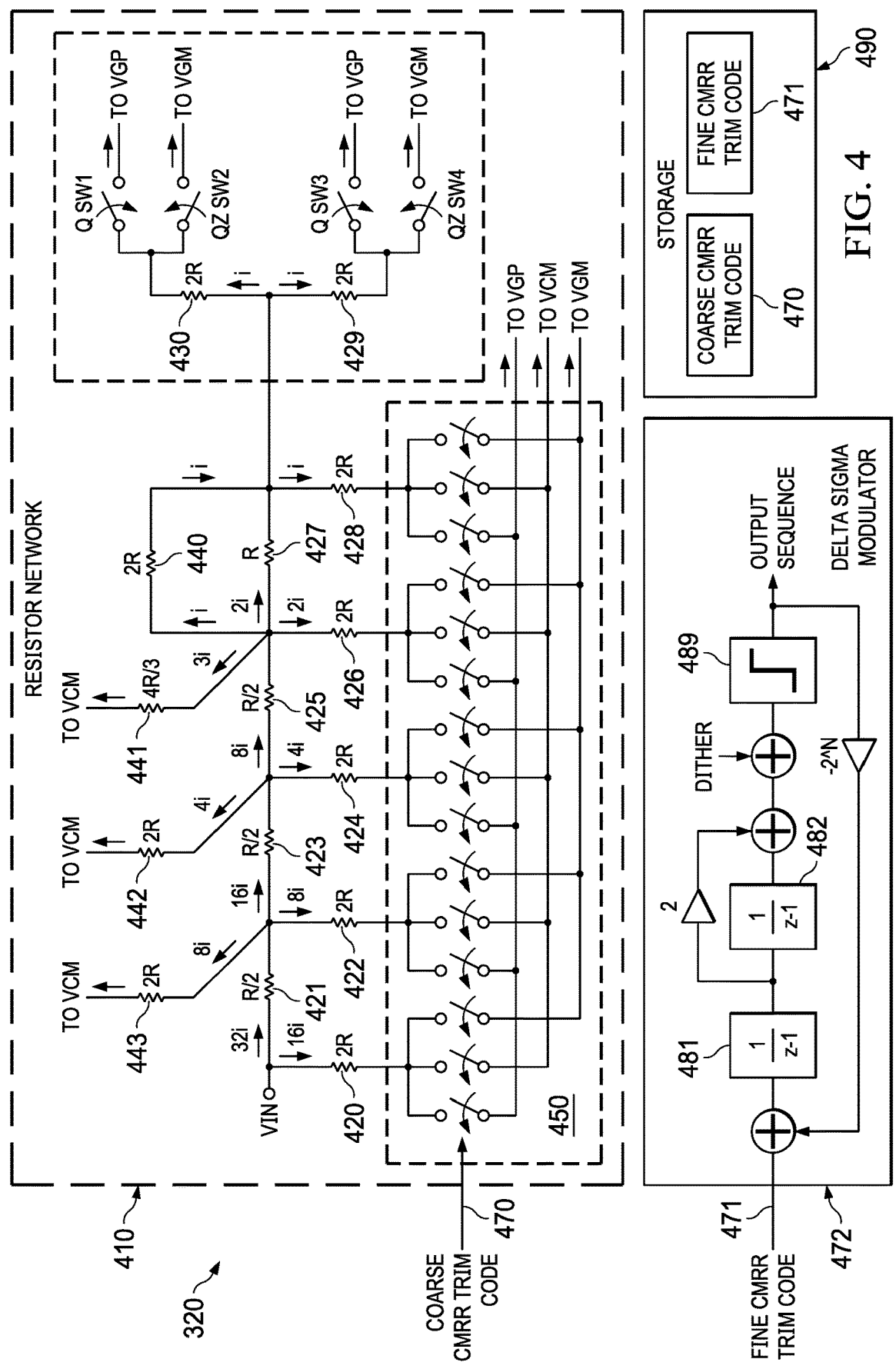
FIG. 4 shows an example implementation of a programmable resistance circuit including a resistor network (a hybrid R-2R network) having a pair of balance resistances and also including a delta sigma modulator.

FIG. 4 shows an example implementation of the programmable resistance circuit 320. In this example, the programmable resistance circuit 320 includes a resistor network 410 coupled to a delta sigma modulator 472. The programmable resistance circuit 320 also includes storage 490 (e.g., a memory device, a register, etc.). The resistor network 410 is a hybrid "R-2R" resistor network. A traditional R-2R network includes repeating cells ("legs") in which each cell includes a unit resistor (R) coupled to a 2R resistor, and also includes a balance resistor to help ensure binary weighting of the various legs of the R-2R network. The resistor network 410 shown in FIG. 4, however, includes two balance resistances (resistors 429 and 430), instead of just one as in a traditional R-2R network. Each balance resistor 429, 430 may be implemented as a combination of one or more unit resistors (R). Each of balance resistors 429 and 430 may also be referred to as balance "resistance" in recognition that each balance resistor 429, 430 may comprise more than one resistor. The additional balance resistor 430 (in addition to balance resistor 429) helps to cover the residual error created by the by the resistor network 410 using the coarse CMRR trim code 470. The residual error created by the resistor network 410 may be higher than the range of a single balance resistor (due to mismatches in the resistors of the resistor network 410). Two balance resistors adequately account for the residual error.

The resistor network 410 includes resistances 420-430 and 440-443. Each resistance comprises one or more resistors that have the nominal effect resistances shown. The resistances may comprise one or more unit resistors (R) coupled together to form the resistances shown. Each of resistances 420, 422, 424, 426, 428-430, 440, 442, and 443 is a 2R resistance. Each of resistances 421, 423, and 425 is an R/2 resistance (one-half the unit resistance). Resistance 441 is a 4R/3 resistance.

Switches 450 selectively couple each 2R resistance 420, 422, 424, 426, and 428 to one of the nodes: VGP, VCM, or VGM. A coarse CMRR trim code 470 controls the switches 450 to permit current to flow selectively through the corresponding 2R resistance 420, 422, 424, 426, and 428 to the VGP node, the VCM node, or the VGM node. The coarse CMRR trim code 470 is stored in storage 490. In one example, the coarse CMRR trim code 470 is implemented in sign magnitude form, but can be implemented in other forms such as 2's complement. In the example of FIG. 4, five resistors (resistors 420, 422, 424, 426 and 428) are controlled by the coarse CMRR trim code 470. In sign magnitude form, one bit of the trim code is used to represent direction of correction and the other bits are used to represent the magnitude. To control five resistors, the coarse trim code 470 includes six bits. The most significant bit controls the direction of application meaning whether the resistors (420 through 428) should be connected to VGP or VGM. The remaining five bits of the trim code control whether each respective resistor is connected to VCM (when the bit is 0) or to VGP/VGM (when the bit is 1 and depending on the direction of the sign bit (MSB bit). For example, when the coarse CMRR trim code 470 is '000000' or '100000' then all resistors are connected to VCM. When the coarse trim code 470 '011111', then resistors 420-428 are connected to VGP. When the coarse trim code 470 is '111111' the resistors are connected to VGM.

The delta sigma modulator 472 receives a fine CMRR trim code 471 (also stored in storage 490). The delta sigma modulator 472 may comprise a second order delta sigma modulator. The delta sigma modulator generates an output bit sequence Q (and its complement QZ) to control the on/off states of switches SW1, SW2, SW3, and SW4. The use of delta sigma modulator helps to ensure that relatively little noise is injected into the AFE 310 within the audio frequency range. SW1 is coupled between resistance 430 and VGP. SW2 is coupled between resistance 430 and VGM. SW3 is coupled between resistance 429 and VGP. SW1 is coupled between resistance 429 and VGM. The Q signal controls SW1 and SW3, and QZ controls SW2 and SW4. As such, SW1 and SW2 are not both on at the same time and similarly, SW3 and SW4 are not both on at the same time. The Q signal causes SW1 and SW3 to be turned on simultaneously (and SW2 and SW4 are off due to QZ). The QZ signal causes SW2 and SW4 to be turned on simultaneously (and SW1 and SW3 are off due to Q). While SW1 and SW3 are on (and SW2 and SW4 are off) current (i) flows through each of balance resistances 429 and 430 to VGP. Then, while SW2 and SW4 are on (and SW1 and SW3 are off), current i flows through each of balance resistances 429 and 430 to VGM.

If switches SW1-SW4 are operated with an average duty cycle of 50%, then effectively zero differential current is added to the input of OP1. However, by controlling the duty cycle to a value different than 50%, sub-LSB (least significant bit) correction current is added to the input of OP1. As such, using the dual balance resistances 429, 430 and switching them between the VGP and VGM virtual ground nodes, the balance portion of the resistor network helps to increase the resolution of the resistor network 410 thereby permitting the resulting AFE 310 to have a higher CMRR.

Because two balance resistances 429 and 430 are used (to increase the correction range of the balance stage of the resistor network 410 to correct for the full range of the residual error as noted above), with current i flowing each of the resistances 429 and 430, twice the current flows through the combined balance resistances of the resistor network 410 than would be the case for a single balance resistance-based, traditional R-2R network. However, the additional balance resistance degrades the linearity performance compared to a traditional R-2R resistor network. To increase the correction range of the balance stage of the resistor network 410 while preserving the linearity of the resistor network, an additional (compared to a traditional R-2R network) compensation resistance 440 is coupled in parallel across unit resistance 427. To ensure that the binary weight ratios of the resistor network are maintained, resistances 441-443 are added (relative to a traditional R-2R network). FIG. 4 shows the relative current magnitudes through the various branches of the resistor network. Resistance 4R/3 causes a 3i current to flow through that resistance to thereby maintain an integer power of two current (e.g., 8i) through resistance 425. Resistance 442 is a 2R resistance to cause a 4i current to flow through that resistance so that the current through resistance 423 is the next higher integer power of two compared to the current through resistance 425. That is, the current through resistance 423 is 16i. Resistance 443 is included for much the same reason as resistance 442. The resistances 421, 423, and 425 comprise R/2 resistances instead of unit resistances R as would have been the case for an R-2R ladder.

The delta sigma modulator 472 is used in the example of FIG. 4 to generate the signals to control switches SW1-SW4. While a pulse width modulation (PWM) clock could be used to control the switches SW1-SW4, using a clock may result in noise being injected into the AFE 310 within the audio frequency range. Delta sigma modulator 472, however, injects noise above the audio frequency range with relatively little noise being injected into the audio frequency range. [In one example, a delta sigma modulator 472 comprises a quantizer (a noise injector) 489 coupled with integrators 481 and 482 (depending on the order of the modulator) to form a loop. The integrators 481/482 form the first stages of the loop, while the quantizer 489 forms the last stage. Because the integrators 481/482 have substantial gain at low frequencies, the noise injected by the quantizer 489 will be rejected at the frequencies where the integrator gain is high (at low frequencies). At higher frequencies (at which the integrators 481/482 do not have high gain), the noise of the quantizer 489 is not rejected. In this way a delta sigma modulator adds low noise at low frequencies. Because the audio band is at a relatively low frequency (e.g., 20 Hz to 20 KHz), delta sigma modulator 472 advantageously adds low level noise in the audio band. However, such higher frequency noise (above the audio band) may still intermodulate with other high frequency noise within the system thereby resulting in some added noise within the audio band.

Figure 5:
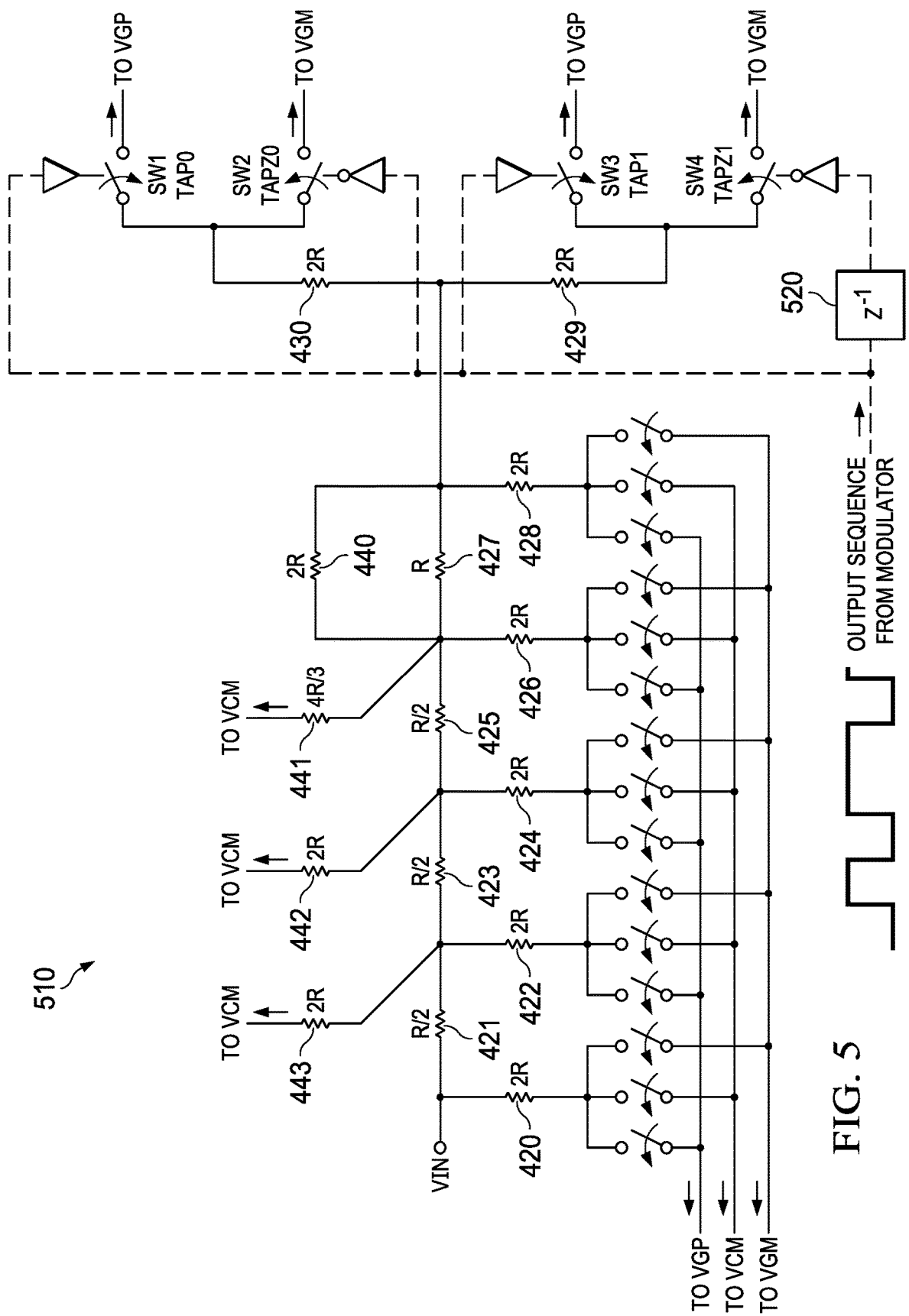
FIG. 5 shows an example of a programmable resistance circuit that includes a two-tap finite impulse response (FIR) filter to attenuate noise above the audio band.

FIG. 5 shows an example of a resistor network similar to that of FIG. 4 but including a finite impulse response (FIR) filter. The FIR filter comprises a delay 520 and the dual switched balance resistances 429 and 430 and the corresponding switches SW1-SW4. The delay 520 delays the switch control signals Q and QZ for SW3 and SW4 relative to SW1 and SW2. The FIR filter in this example comprises a two-tap FIR filter. The two-tap FIR filter is a notch filter and advantageously attenuates noise at frequencies within the notch—the notch occurring at frequencies above the audio band.

Figure 6:
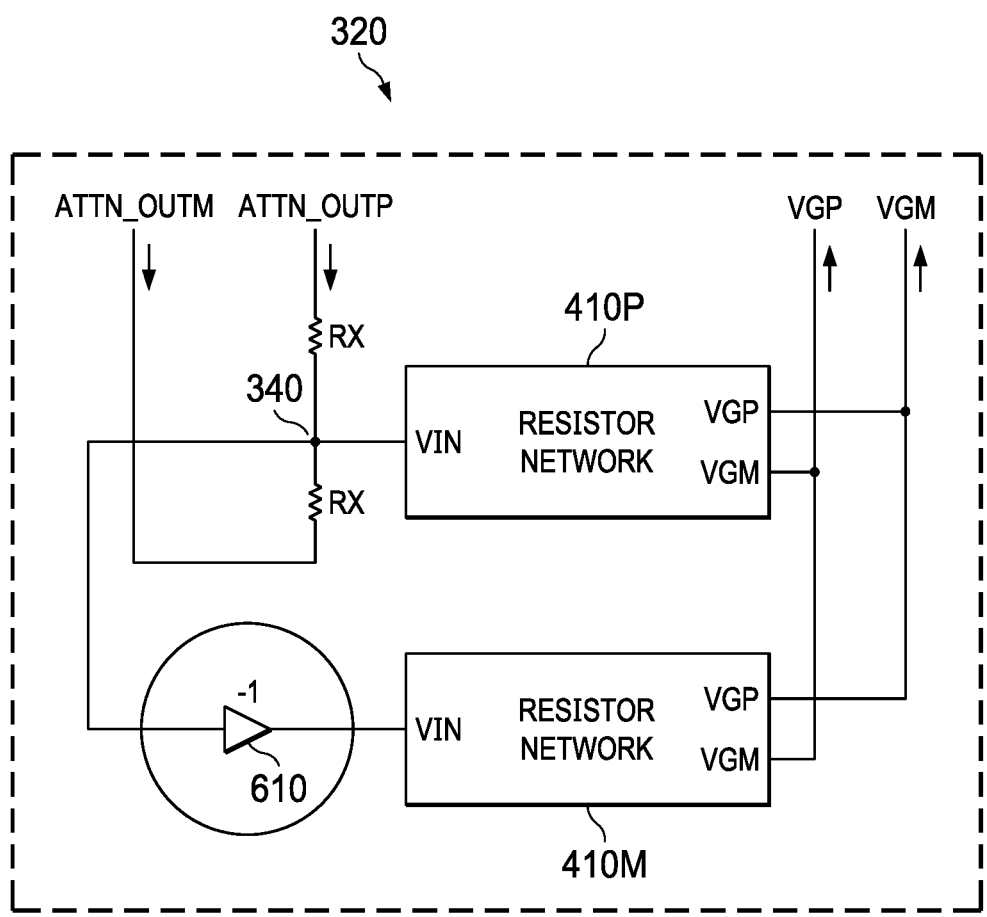
FIG. 6 shows the use of two resistor networks with the AFE, with one resistor network operating from an inverted input voltage compared to the other resistor network.

To mitigate charge-injection due to the switching of the two balance resistances 429 and 430, in the example of FIG. 6 the programmable resistance circuit is implemented as a pair of resistor networks 410P (for the P side of the AFE 310) and 410M (for the M side of the AFE 310). The VGP outputs of the resistor networks 410P and 410M are coupled together as shown, and the VGM outputs also are coupled together. This circuit architecture ensues that the number of elements switching to and from VGP and VGM is the same regardless of the sequence. As such, symmetry between VGP and VGM is maintained. However, to operate the M side resistor network 410M, the input VIN to the resistor network 410M should be the negative version of the input common mode voltage to VIN of resistor network 410P. In one implementation, an inverting amplifier 610 can be included to invert the input voltage of node 340 to VIN of the resistor network 410M.

Figure 7:
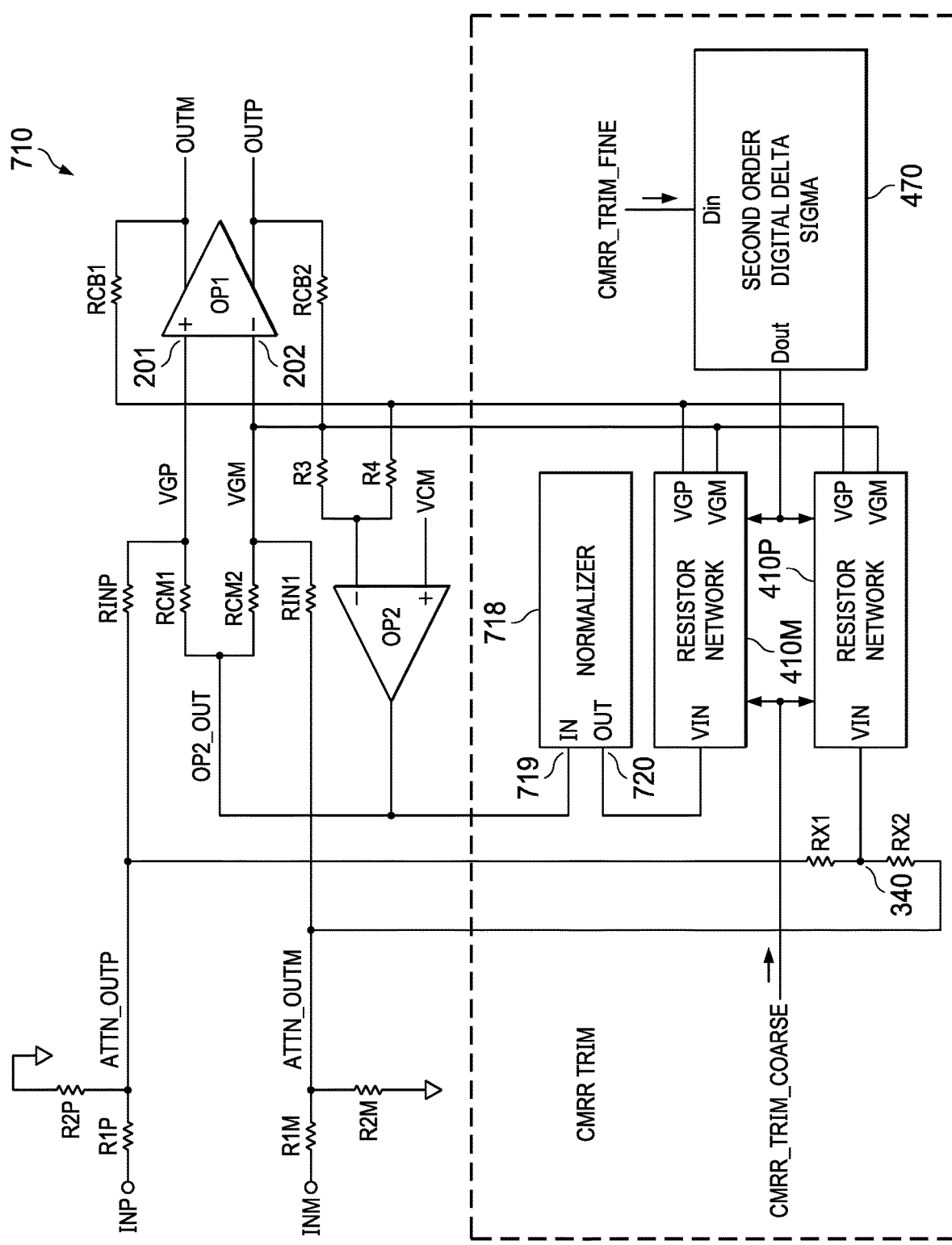
FIG. 7 shows another example of an AFE that includes the two resistor networks.

FIG. 7 shows another example implementation of an AFE 710, much as has been shown and describe above. The two resistor networks 410P and 410M are shown as well as the delta sigma modulator 472 (which may include a two-tap FIR filter as explained above). In the example AFE 710 of FIG. 7, rather than including an inverting amplifier (as in FIG. 6) to generate the input voltage (VIN) for the resistor network 410M, a normalizer 718 is included. The normalizer 718 has an input (IN) 719 and an output (OUT) 720. The normalizer's input 719 is coupled to the output of OP2. The normalizer's output 720 is coupled to VIN of the resistor network 410M. The normalizer 718 normalizes the output voltage (OP2_OUT) from OP2 to an appropriate level relative to the voltage on node 340 between Rx1 an Rx2. In one example, the normalizer 718 comprises a resistor divider. The signal (OP2_OUT) on the output of OP2 may be different than the voltage at node 340 between resistors Rx1 and Rx2. The normalizer 718 receives the voltage OP2_OUT and outputs a different voltage that is equal or approximately to the voltage of node 340.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   an analog-to-digital converter (ADC) having an ADC input;
   an analog front end (AFE) having an AFE input and an AFE output, the AFE output coupled to the ADC input, the AFE including a programmable gain amplifier (PGA) having a first PGA input and a second PGA input, the PGA including a first operational amplifier (OP AMP) having a first OPAMP input and a second OPAMP input, the AFE also including a programmable resistance circuit; and
   wherein the programmable resistance circuit has a first programmable resistance circuit input and first and second programmable resistance circuit outputs, the first programmable resistance circuit input is coupled to the first and second PGA inputs; and
   wherein the programmable resistance circuit includes a resistor network having first and second balance resistances, the first balance resistance is coupled to the first and second OP AMP inputs, and the second balance resistance is coupled to the first and second OP AMP inputs.

2. The circuit of claim 1, further including a delta sigma modulator coupled to the first and second balance resistances.

3. The circuit of claim 2, further including a filter coupled to an output of the delta sigma modulator.

4. The circuit of claim 2, further including a delay coupled between the delta sigma modulator and one of the first and second balance resistances.

5. The circuit of claim 2, wherein the programmable resistance circuit includes:
   a first switch having a control input and the first switch is coupled between the first balance resistance and the first OP AMP input;
   a second switch having a control input and the second switch is coupled between the first balance resistance and the second OP AMP input;
   a third switch having a control input and the third switch is coupled between the second balance resistance and the first OP AMP input; and
   a fourth switch having a control input and the fourth switch is coupled between the second balance resistance and the second OP AMP input;
   wherein the delta sigma modulator includes respective control outputs coupled to the control inputs of the first, second, third, and fourth switches.

6. The circuit of claim 1, wherein the programmable resistance circuit is a first programmable resistance circuit and the AFE includes a second programmable resistance circuit, wherein the second programmable resistance circuit includes a resistor network having first and second balance resistances, the first balance resistance of the second programmable resistance circuit is coupled to the first and second OP AMP inputs, and the second balance resistance of the second programmable resistance circuit is coupled to the first and second OP AMP inputs.

7. The circuit of claim 6, wherein the AFE includes a second OP AMP having a second OP AMP output, and wherein the second programmable resistance circuit includes a second programmable resistance input coupled to the second OP AMP output.

8. The circuit of claim 6, further comprising a voltage level shifter circuit coupled between the second OP AMP output and the second programmable resistance input.

9. A circuit, comprising:
   a first operational amplifier (OP AMP) having a first OP AMP input and a second OP AMP input;
   a first resistor coupled to the first OP AMP input, the first resistor providing a positive input;
   a second resistor coupled to the second OP AMP input, the second resistor providing a negative input;
   a programmable resistance circuit having a programmable resistance input, a first programmable resistance output, and a second programmable resistance output, the programmable resistance input coupled to the positive and negative inputs, the first programmable resistance output coupled to the first OP AMP input, and the second programmable resistance output coupled to the second OP AMP input; and
   wherein the programmable resistance circuit includes a resistor network having first and second balance resistances, the first balance resistance is coupled to the first and second OPAMP inputs, and the second balance resistance is coupled to the first and second OPAMP inputs.

10. The circuit of claim 9, wherein the first OP AMP includes an output, and the circuit further includes an analog-to-digital converter (ADC) coupled to the output of the first OP AMP.

11. The circuit of claim 9, further including a delta sigma modulator coupled to the first and second balance resistances.

12. The circuit of claim 11, further including a filter coupled to an output of the delta sigma modulator.

13. The circuit of claim 11, further including a delay coupled between the delta sigma modulator and one of the first and second balance resistances.

14. The circuit of claim 11, further including storage configured to store a trim code to be provided to the delta sigma modulator.

15. The circuit of claim 9, wherein the programmable resistance circuit includes:
   a first switch having a control input and the first switch is coupled between the first balance resistance and the first OP AMP input;
   a second switch having a control input and the second switch is coupled between the first balance resistance and the second OP AMP input;
   a third switch having a control input and the third switch is coupled between the second balance resistance and the first OP AMP input; and
   a fourth switch having a control input and the fourth switch is coupled between the second balance resistance and the second OP AMP input.

16. The circuit of claim 9, wherein the programmable resistance circuit is a first programmable resistance circuit and the circuit includes a second programmable resistance circuit, wherein the second programmable resistance circuit includes a resistor network having first and second balance resistances, the first balance resistance of the second programmable resistance circuit is coupled to the first and second OP AMP inputs, and the second balance resistance of the second programmable resistance circuit is coupled to the first and second OP AMP inputs.

17. A circuit, comprising:
a first operational amplifier (OP AMP) having a first OP AMP input and, a second OP AMP input, and a first OP AMP output;
a second OP AMP having a first OP AMP input, a second OP AMP input, and an OP AMP output, the first OP AMP input of the second OP AMP coupled to the first OP AMP output of the first OP AMP;
a first resistor coupled to the first OP AMP input of the first OP AMP, the first resistor providing a positive input;
a second resistor coupled to the second OP AMP input of the first OP AMP, the second resistor providing a negative input;
a first programmable resistance circuit having a programmable resistance input, a first programmable resistance output, and a second programmable resistance output, the programmable resistance input of the first programmable resistance circuit coupled to the positive and negative inputs, the first programmable resistance output of the first programmable resistance circuit coupled to the first OP AMP input of the first OP AMP, and the second programmable resistance output of the first programmable resistance circuit coupled to the second OP AMP input of the first OP AMP; and
a second programmable resistance circuit having a programmable resistance input, a first programmable resistance output, and a second programmable resistance output, the programmable resistance input of the second programmable resistance circuit coupled to the OP AMP output of the second OP AMP, the first programmable resistance output of the second programmable resistance circuit coupled to the first OP AMP input of the first OP AMP, and the second programmable resistance output of the second programmable resistance circuit coupled to the second OP AMP input of the first OP AMP.

18. The circuit of claim 17, further including a normalizer circuit coupled between the first OP AMP output of the second OP AMP and the programmable resistance input of the second programmable resistance circuit, the normalizer circuit configured to adjust a voltage on the first OP AMP output of the second OP AMP to be provided to the programmable resistance input of the second programmable resistance circuit.

19. The circuit of claim 17, wherein the first programmable resistance circuit includes a resistor network and the second programmable resistance circuit include includes a resistance network, and the circuit further includes a delta sigma modulator coupled to the first and second programmable resistance circuits.

20. The circuit of claim 19, further including a finite impulse response (FIR) filter coupled to the delta sigma modulator.

* * * * *